United States Patent [19]

Sawada et al.

[11] Patent Number: 4,984,208

[45] Date of Patent: Jan. 8, 1991

[54] DYNAMIC READ/WRITE MEMORY WITH IMPROVED REFRESHING OPERATION

[75] Inventors: Kazuhiro Sawada, Yokohama; Takayasu Sakurai, Tokyo; Kazutaka Nogami, Kawasaki, all of Japan

[73] Assignee: Kabushiki Kaisha Toshiba, Kawasaki, Japan

[21] Appl. No.: 364,529

[22] Filed: Jun. 12, 1989

Related U.S. Application Data

[63] Continuation of Ser. No. 12,315, Feb. 9, 1987, abandoned.

[30] Foreign Application Priority Data

Feb. 14, 1986 [JP] Japan .................................. 61-30139

[51] Int. Cl.$^5$ ...................... G11C 7/00; G11C 11/406; G11C 11/401
[52] U.S. Cl. ............................... 365/222; 365/230.06; 365/233
[58] Field of Search ................... 365/230.06, 233, 222, 365/230.02, 189.02, 189.05

[56] References Cited

U.S. PATENT DOCUMENTS

| | | | |
|---|---|---|---|
| 4,328,566 | 5/1982 | Thaler | 365/222 |
| 4,672,583 | 1/1987 | Nakaizumi | 365/222 |
| 4,677,592 | 6/1987 | Sakurai et al. | |
| 4,718,041 | 1/1988 | Baglee et al. | 365/222 |
| 4,747,082 | 5/1988 | Minato et al. | 365/222 |
| 4,757,217 | 7/1988 | Sawada et al. | |
| 4,777,624 | 10/1988 | Ishizawa et al. | 365/222 X |
| 4,809,233 | 2/1989 | Takemae | 365/222 |
| 4,827,453 | 5/1989 | Sawada et al. | 365/222 |
| 4,849,936 | 7/1989 | Mizutani | 365/222 X |

FOREIGN PATENT DOCUMENTS

| | | |
|---|---|---|
| 0166974 | 8/1986 | European Pat. Off. . |
| 2543515 | 4/1977 | Fed. Rep. of Germany . |
| 61-029320 | 1/1986 | Japan . |
| 59111894 | 8/1987 | Japan . |

OTHER PUBLICATIONS

Patent Abstracts of Japan, vol. 5, No. 48 (P-55)[720], Apr. 7, 1981 for JP-A-56 3496 (Hitachi Seisakusho K.K.) 14-01-81.

Primary Examiner—Alyssa H. Bowler
Attorney, Agent, or Firm—Finnegan, Henderson, Farabow, Garrett, and Dunner

[57] ABSTRACT

A dynamic read/write memory in which refreshing is performed within a read/write cycle so that write recovery time is not prolonged. A word line corresponding to a current address is continuously rendered operative within a write period. When a write operation is completed, the word line is rendered operative so that refreshing is initiated. A word line is rendered operative only within a given period of a read period.

9 Claims, 7 Drawing Sheets

DYNAMIC READ/WRITE MEMORY WITH IMPROVED REFRESHING OPERATION

This application is a continuation of application Ser. No. 07/012,315, filed Feb. 9, 1987, now abandoned.

BACKGROUND OF THE INVENTION

The present invention relates to a dynamic read/write memory for refreshing storage data in a normal data read/write cycle and, more particularly, to an improvement of a control circuit for controlling word lines or a column decoder for such a memory.

A so-called pseudo static RAM (to be referred to as a PSRAM hereinafter) is known as a RAM which uses memory cells (e.g., each comprising one transistor and one capacitor) requiring refreshing of storage data, which does not require the complicated timing signals used in a dynamic RAM, such as a column address strobe signal (CAS) and a row address strobe signal (RAS), and which can be used in the same manner as a normal static RAM. The refreshing operation must be performed before or after the normal read/write cycle in a conventional PSRAM. Refreshing timings must be set by a user, which can be inconvenient.

Assume that data is refreshed during address decoding or at the end of read/write access, i.e., that data refreshing is performed in parallel with data read/write access in one cycle. FIG. 1 shows a schematic arrangement of a dynamic read/write memory (DRAM), and FIGS. 2A to 2I are timing charts for explaining the operation of the DRAM. It is also assumed that a pair of bit lines BL and $\overline{BL}$ are precharged.

If address input signal ADD (FIG. 2A) is changed, or when a chip enable signal (not shown in FIG. 2) is input, a memory operation cycle is initiated. The change in signal ADD causes an address decoder (not shown) to select one word line WL1, and corresponding signal NWL1 (FIG. 2B) becomes "H". Storage data in memory cell 51 and data in dummy cell 52 are read out onto a pair of bit lines BL and $\overline{BL}$ (FIG. 2G), and a slight potential difference occurs between the bit lines. Sense amplifier 53 is then operated in response to sense enable signal SAE (FIG. 2C), and the potential difference is amplified by amplifier 53. Subsequently, column decoder 54 is operated in response to column decoder enable signal CDE (FIG. 2E), and data signals on the bit lines BL and $\overline{BL}$ are decoded. The decoded signals appear on a pair of data lines DL and $\overline{DL}$ (FIG. 2H). The data signals on the lines DL and $\overline{DL}$ are waveshaped by input/output circuit 55. As a result, the waveshaped signals are output as active data from data input/output terminal I/O (FIG. 2I).

Signal CDE is supplied as a pulse signal to decoder 54 and becomes "L" after input/output circuit 55 latches active data. When signal CDE becomes "L", signal NWL1 becomes "L" to render line WL1 inoperative. Amplifier 53 is then disenabled in response to "L" of signal SAE, and lines BL and $\overline{BL}$ are precharged.

Refreshing drive signal RWL2 (FIG. 2D) is supplied to word line WL2 to render sense amplifier 53 operative, and data is rewritten in memory cell 51. During the refreshing operation, data need not be output from the memory. Signal CDE is kept "L", and column decoder 55 is kept inoperative. In this case, the active data latched by input/output circuit 55 appears at terminal I/O.

The word lines (WL1, WL2) are driven in response to pulses as described above, and thus the refreshing operation can be performed in one cycle.

The present inventors developed a control circuit for switching between normal data read/write access (to be referred to as a normal operation hereinafter) and refreshing operation. The control circuit is shown in FIG. 3. In this circuit, normal operation request signal NREQ is generated by reset-set flip-flop (RS FF) 61 which is set in response to normal operation start instruction signal NSET and is reset in response to normal operation end instruction signal NRST. Refreshing operation request signal RREQ is generated by RS FF 62 which is set in response to refreshing operation start instruction signal RSET and is reset in response to refreshing operation end instruction signal RRST. Signals NREQ and RREQ are supplied as input signals to signal selection circuit 65 constituted by NAND gates 63 and 64.

An output signal from NAND gate 63 is inverted by inverter 66, and normal operation control circuit 67 is operated in response to output signal NGO from inverter 66. Similarly, an output signal from NAND gate 64 is inverted by inverter 68, and refreshing operation control circuit 69 is rendered operative in response to output signal RGO from inverter 68. In this manner, the normal and refreshing operations are switched.

The word lines are driven by control circuits 67 and 69, in response to pulses as described above. In the normal operation, particularly in the data write mode, the following problem occurs. This problem will be described with reference to the timing charts in FIGS. 4A to 4E.

Assume that write enable signal $\overline{WE}$ rises at time t0 in FIG. 4B. In this case, the circuit in FIG. 3 generates normal operation request signal NREQ and causes normal operation word line drive signal NWL1 on word line WL1 to become "H". It is further assumed that the refreshing operation has already started at time t0. At time t1, when signal RWL becomes "L" after the refreshing operation is completed, signal NWL1 (FIG. 4C), corresponding to address input signal ADD (FIG. 4A), becomes "H", and data write access is initiated. In this case, a period t(WR) (FIG. 4A) between the leading edge of write enable signal $\overline{WE}$ and the next change in signal ADD becomes long. Thus, the one-cycle period of the DRAM is undesirably prolonged, only in the write mode. In other words, when a refreshing operation is performed in the normal operation in the above-mentioned DRAM control circuit, the data write cycle time is undesirably prolonged.

SUMMARY OF THE INVENTION

It is accordingly an object of the present invention to provide a control circuit of a dynamic read/write memory (DRAM), for refreshing storage data within a read/write cycle thereof, wherein data can be written without prolonging the period of the read/write cycle.

A DRAM control circuit according to the present invention refreshes storage data within the read/write cycle period and comprises means for rendering a word line, corresponding to a predetermined address, operative within a predetermined period of the read cycle period, and means for continuously rendering a word line, corresponding to a predetermined address, operative within a write cycle period. With this arrangement, there is provided a DRAM whose write cycle period can be substantially equal to the read cycle period.

DETAILED DESCRIPTION OF THE PREFERRED EMBODIMENTS

The general operation of a DRAM control circuit according to the present invention will be described first.

As shown in the timing charts of FIGS. 5A to 5F, assume that address input signal ADD (FIG. 5A) is changed at time t0, and that write enable signal $\overline{WE}$ (FIG. 5B) becomes "L" at time t1, to thereby generate a data write request ($\overline{WE}$="L"). It is also assumed that refreshing word line drive signal RWL (FIG. 5D) has been "H" at this time, so that refreshing operation is performed. Under this assumption, at time t2, when the bit lines are completely precharged after refreshing operation is completed and signal RWL becomes "L", signal NWL1, corresponding to signal ADD, becomes "H", as indicated by the solid line in FIG. 5C.

Figure 5:
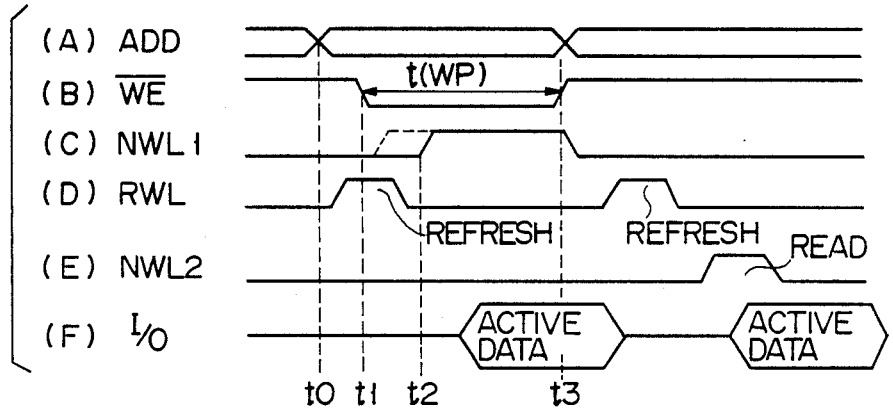
FIGS. 5A to 5F are a timing charts for explaining the basic operation of the DRAM according to the present invention.
Figure 6:
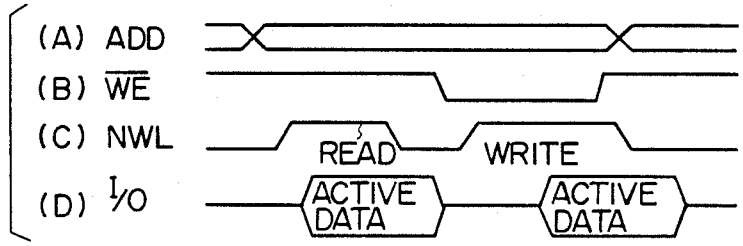
FIGS. 6A to 6D are timing charts for explaining another operation of the DRAM according to the present invention.

However, if the refreshing operation is not performed, signal NWL1 on the word line, corresponding to signal ADD, becomes "H" at time t1, as indicated by the dotted line in FIG. 5C, at which write enable signal $\overline{WE}$ becomes "L" (FIG. 5B).

After word line drive signal NWL1 becomes "H", the DRAM control circuit keeps signal NWL1 at "H" level until period t(WP) (FIG. 5B) for keeping $\overline{WE}$ at "L" level ends at time t3, and the refreshing operation cannot be performed within this period (NWL1="H"). At time t3 when signal $\overline{WE}$ becomes "H", active data (FIG. 5F) is written in a given memory cell defined by address input signal ADD (FIG. 5A). In this case, the DRAM control circuit causes signal NWL1 to become "L" after completing this data writing. If a refreshing request (RREQ in FIG. 3) is detected, refreshing word line drive signal RWL (FIG. 5D) becomes "H" after signal NWL1 becomes "L" (at time t3 in FIG. 5C).

If read modify write, as shown in the timing charts of FIGS. 6A to 6D, is to be performed, after the word line is driven in response to pulse signal NWL (FIG. 6C) so as to read the active data (FIG. 6D), write enable signal $\overline{WE}$ (FIG. 6B) subsequently becomes "L", so that data is written at the leading edge of this signal $\overline{WE}$. In this case, signal NWL statically becomes "H" in response to "L" level of write enable signal $\overline{WE}$.

An embodiment of the present invention will be described with reference to the accompanying drawings.

Figure 7:
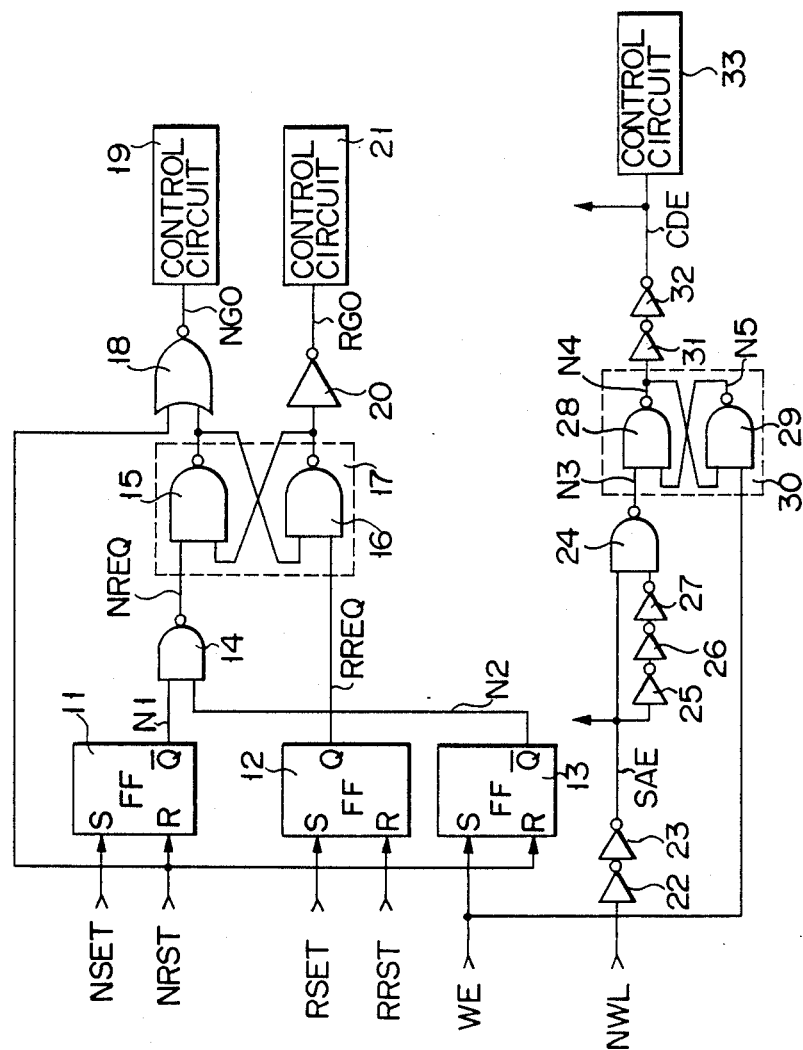
FIG. 7 is a circuit diagram showing a DRAM control circuit according to an embodiment of the present invention.

FIG. 7 is a circuit diagram showing an arrangement of a DRAM control circuit according to the present invention. Referring to FIG. 7, normal operation start instruction signal NSET and normal operation end instruction signal NRST are respectively input to set and reset input terminals S and R of RS FF 11. Similarly, refreshing operation start instruction signal RSET and refreshing operation end instruction signal RRST are respectively input to set and reset input terminals S and R of RS FF 12. Set input terminal S of RS FF 13 receives write enable signal WE to be set at "H" level in the data write request mode. Reset input terminal R of RS FF 13 receives signal NRST.

$\overline{Q}$ output signal N1 from RS FF 11 is input to one input terminal of 2-input NAND gate 14. $\overline{Q}$ output signal N2 from RS FF 13 is input to the other input terminal of NAND gate 14. An output signal from NAND gate 14 is supplied, as normal operation request signal NREQ, to one input terminal of 2-input NAND gate 15. A Q output signal from RS FF 12 is supplied, as refreshing operation request signal RREQ, to one input terminal of 2-input NAND gate 16. The output signal of NAND gate 16 is input to a second input terminal of NAND gate and the output signal of 15 NAND gate 15 is input to a second input terminal of NAND gate 16. NAND gates 15 and 16 constitute selection circuit 17 for selecting one of signals NREQ and RREQ.

The output signal from NAND gate 15 is supplied to one input terminal of 2-input NOR gate 18. The other input terminal of NOR gate 18 receives normal operation end instruction signal NRST. Output signal NGO from NOR gate 18 is supplied to normal operation control circuit 19. Circuit 19 is provided for rendering word line WL of FIG. 1 operative during the normal operation period, in response to drive signal NWL. The output signal from NAND gate 16 is supplied to inverter 20. Output signal RGO from inverter 20 is supplied to refreshing operation control circuit 21. Circuit 21 is provided for rendering word line WL operative or inoperative, in response to drive signal RWL.

Drive signal NWL for word line WL is supplied, via two series-connected inverters 22 and 23, to one input terminal of 2-input NAND gate 24. An output signal from inverter 23 is used as sense amplifier enable signal SAE for controlling the operation of sense amplifier 53 in FIG. 1. Inverters 22 and 23 serve to delay the signal edge of NWL by a predetermined time, and also serve to render amplifier 53 operative. Output signal SAE from input terminal 23 is supplied, via three series-connected inverters 25, 26 and 27, to the other input terminal of NAND gate 24.

NAND gate 24 and three inverters 25 to 27 constitute a differentiation circuit for differentiating signal SAE to generate pulse signal N3 having a predetermined pulse width.

Output signal N3 from NAND gate 24 is supplied to one input terminal of 2-input NAND gate 28. Write enable signal WE is supplied to one input terminal of 2-input NAND gate 29. The output signal of NAND gate 28 is input to a second input terminal of NAND gate 29. The output signal of NAND gate 29 is input to a second input terminal of NAND gate 28. NAND gates 28 and 29 constitute signal latch/transfer control circuit 30 for either latching or transferring signal N3 in response to write enable signal WE.

Signal N4, which is one of output signals N4 and N5 from NAND gates 28 and 29, is supplied to two series-connected inverters 31 and 32. An output signal from output-stage inverter 32 is supplied, as column decoder enable signal CDE, to column decoder 54 in FIG. 1 and to normal operation control circuit 33. Circuit 33 is provided for rendering word line WL inoperative for the normal operation period, in response to drive signal NWL.

FIGS. 8 to 11 are timing charts respectively explaining data write control of the DRAM using the control circuit of FIG. 7.

The operation in the timing charts of FIGS. 8A to 8T exemplifies a case wherein chip enable signal $\overline{CE}$ (FIG. 8A) and write enable signal WE (FIG. 8C) are simultaneously enabled at time t1. In this case, a pulse generator (not shown) generates normal operation start instruction signal NSET (FIG. 8B) in response to the signal edge of $\overline{CE}$. RS FF 11 in FIG. 7 is set in response to signal NSET, and $\overline{Q}$ output signal N1 (FIG. 8D) thereof becomes "L". At the same time, RS FF 13 is set in response to write enable signal WE, and its $\overline{Q}$ output signal N2 (FIG. 8E) becomes "L".

NAND gate 14 receives signals N1 and N2, and outputs signal NREQ (FIG. 8F) set at "H". During a period prior to time t1, both signals N1 and N2 are set at "H", and signal NREQ is set at "L" (FIGS. 8D–8F). In addition, during this period, RS FF 12 is held in the reset state, and thus signal RREQ (FIG. 8P) is set at "L". Therefore, output signals from NAND gates 15 and 16 in selection circuit 17 are both set at "H".

Figure 1:
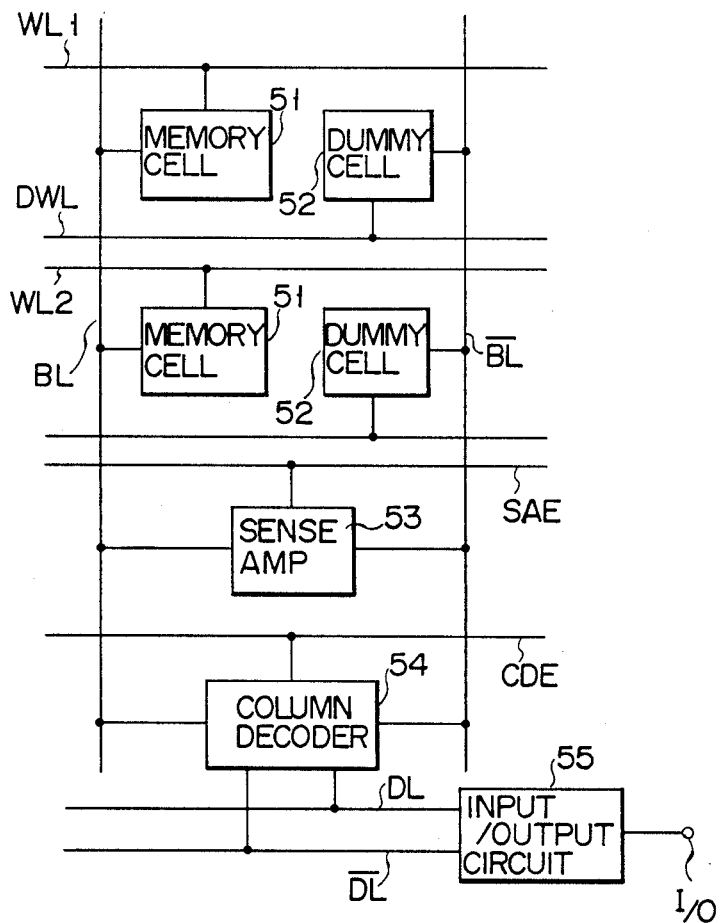
FIG. 1 is a block diagram showing a schematic arrangement of a DRAM for parallel performing data read/write access and refreshing operation within one operation cycle.

When signal NREQ becomes "H", an output signal from NAND gate 15 becomes "L". In this case, signal NRST (FIG. 8N) is not generated and is kept "L". When signal NREQ becomes "H", an output signal from NOR gate 18 becomes "H". Then, control circuit 19 receives signal NGO (FIG. 8G) and causes normal operation word line drive signal NWL (FIG. 8H) to become "H", so as to render the word line, corresponding to address input signal ADD (FIG. 8T), operative When the word line is rendered operative, sense amplifier enable signal SAE (FIG. 8I), delivered from inverter 23, becomes "H", after the lapse of a predetermined period of time. Then, sense amplifier 53 in FIG. 1 is operated. At time t3 after signal SAE becomes "H", the pulse generator, constituted by NAND gate 24 and three inverters 25 to 27, generates pulse signal N3 (FIG. 8J) having a predetermined pulse width of "L" level.

During a period prior to time t1, both signals NWL and WE (FIGS. 8C and 8H) are set at "L", and output signal N3 (FIG. 8J) from NAND gate 24 is set at "H". The logic levels of output signals N4 and N5 (FIGS. 8K and 8L) from NAND gates 28 and 29 are "L" and "H", respectively. After time t1, even if signal WE becomes "H", the states of signals N4 and N5 are not changed. When signal N3 becomes "L" as described above, signal N4 from NAND gate 28 becomes "H". Since write enable signal WE has already been set at "H" at time t3, output signal N5 from NAND gate 29 becomes "L". Then, signal N5 with "H" level is latched by control circuit 30 and is kept at this logic level "H".

In response to the above operation, output signal CDE (FIG. 8M) from inverter 32 becomes "H" at time t3 and is kept at this logic level "H". Therefore, column decoder 54 in FIG. 1 keeps an active state in response to CDE="H", and control circuit 33 does not disenable word line drive signal NWL. In other words, the word line is kept operative (NWL="H"). This state continues until write enable signal WE becomes "L" at time t5. Data is written at the trailing edge of signal WE at time t5.

At time t4 prior to time t5, when refreshing operation start instruction signal RSET (FIG. 8O) is output from a refreshing timer (not shown in FIG. 7), RS FF 12 is set in response to signal RSET, and refreshing operation request signal RREQ (FIG. 8P), obtained from the Q output of RS FF 12, becomes "H". However, since normal operation request signal NREQ (FIG. 8F) has already been set at "H", the operating state of selection circuit 17 is not changed, and output signal RGO (FIG. 8Q) from inverter 20 is kept "L". For this reason, control circuit 21 does not cause signal RWL (FIG. 8R) to become "H", i.e., does not enable the word line at time t4.

At time t5, write enable signal WE (FIG. 8C) becomes "L". Then, output signal N5 (FIG. 8L) from NAND gate 29 becomes "H" while output signal N4 (FIG. 8K) from NAND gate 28 becomes "L". Thereafter, signal CDE (FIG. 8M) becomes "L", and the operation of column decoder 54 in FIG. 1 is interrupted. At time t6, control circuit 33 generates NRST="H" (FIG. 8N) in response to CDE="L" (FIG. 8M), to thereby provide NGO="L" (FIG. 8G). Word line drive signal NWL (FIG. 8H) becomes "L" at time t6, so that the word line is disabled. When the word line is disabled and signal NWL becomes "L", control circuit 33 generates normal operation end instruction signal NRST (FIG. 8N). Then, signal NRST with "H" level resets RS FFs 11 and 13.

During a period after time t5, output signals N1 and N2 (FIGS. 8D and 8E) are both set at "H". Then, output signal NREQ (FIG. 8F) from NAND gate 14 becomes "L", and output signal NGO (FIG. 8G) from NOR gate 18 becomes "L". In this case, when signal NREQ (FIG. 8F) becomes "L" after time t6, the output signal from NAND gate 16 becomes "L" and signal RGO (FIG. 8Q) becomes "H" at time t7, since signal RREQ (FIG. 8P) is kept at "H" at this time. At time t8, control circuit 21 enables refreshing word line drive signal RWL (RWL="H" in FIG. 8R) to initiate refreshing operation.

Thereafter, at time t9, control circuit 21 disenables signal RWL (RWL="L" in FIG. 8R) to render the word line inoperative, and control circuit 21 generates refreshing operation end instruction signal RRST (RRST="H" in FIG. 8S). RS FF 12 is then reset in response to signal RRST, and refreshing operation request signal RREQ (FIG. 8P) becomes "L", so that signal RGO (FIG. 8Q) becomes "L". At time t10, word line drive signal NWL (FIG. 8H) again becomes "H", so that the word line is rendered operative for the normal read operation.

The above operation exemplifies the case wherein a refreshing request signal is generated after data write access is started. However, even if another refreshing request signal is generated in a period other than a period after the start of the data write access, the same operation, as described above, is performed, except that the refreshing operation is inserted at a timing different from that as described above. Thus, data write operation and refreshing operation can be normally performed regardless of the timing of generation of the refreshing request signal.

In the write operation period, the word line, corresponding to the current address, is continuously rendered operative (NWL="H") within the period of a write cycle. When write operation is completed, the word line is rendered operative (RWL="H" at time t7 in FIG. 8R), so that refreshing operation is initiated.

According to the embodiment of the present invention as described above, write recovery time t(WR) (t5 to t7 in FIG. 8) is not prolonged, unlike in the case described with reference to FIG. 4. The write cycle is ended at time t5, and address ADD is changed at time t7 in FIG. 8, to thereby shorten write recovery time t(WR).

Figure 9:
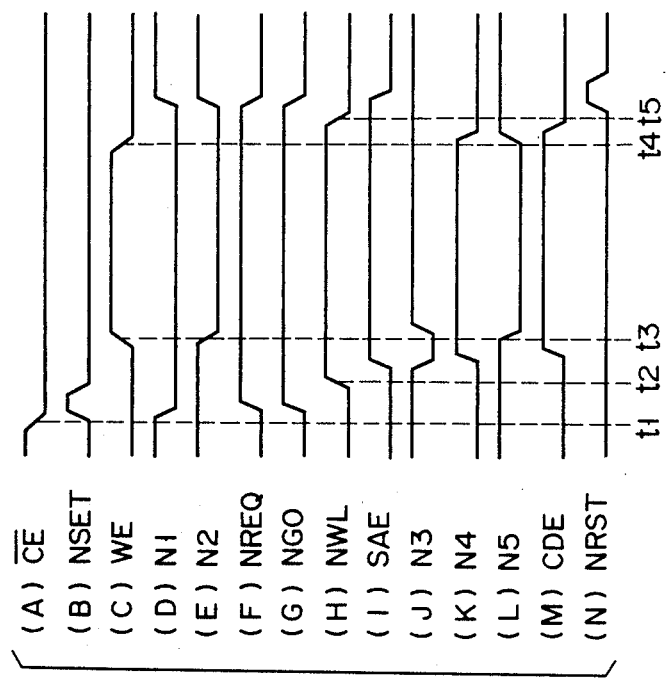
FIGS. 9A to 9N are timing charts for explaining the DRAM data write operation in a read modify write mode, employing the circuit of FIG. 7.
Figure 8:
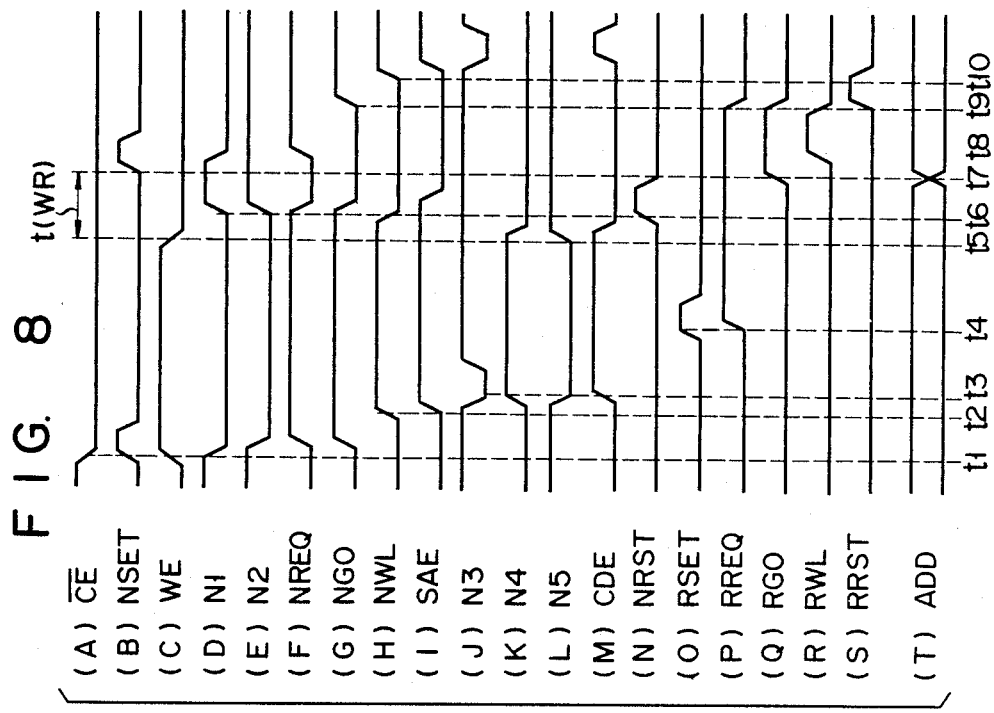
FIGS. 8A to 8T are timing charts for explaining data write operation of a DRAM using the circuit of FIG. 7.
Figure 11:
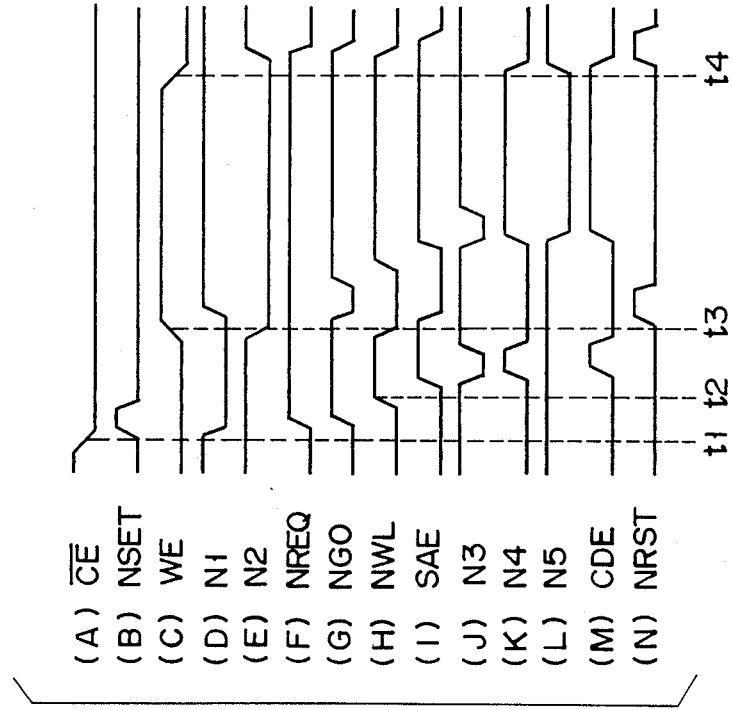
FIGS. 11A to 11N are timing charts for explaining another modification of the operation in FIGS. 9A to 9N.
Figure 10:
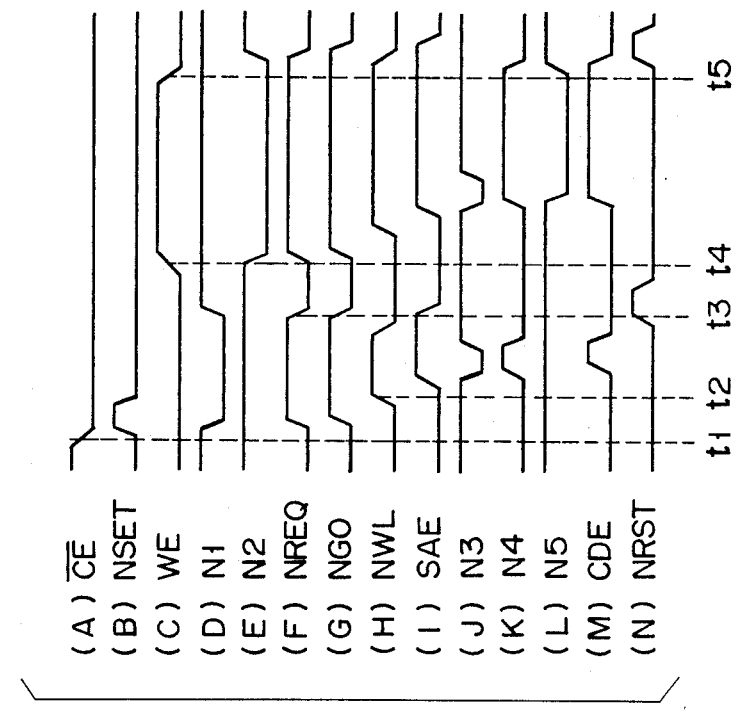
FIGS. 10A to 10N are timing charts for explaining a modification of the operation in FIGS. 9A to 9N.

FIGS. 9 to 11 are timing charts for explaining various operations in a read modify write mode. More specifically, data is read out, and another data is rewritten in the same cell on the basis of the readout data. In this case, chip enable signal $\overline{CE}$ and write enable signal WE are input. Since refreshing operation start instruction signal RSET can be apparently generated in the same manner as in FIG. 8, signal RSET is not shown in FIGS. 9 to 11.

Referring to FIGS. 9A to 9N, chip enable signal $\overline{CE}$ (FIG. 9A) is enabled, i.e., becomes "L" at time t1. Normal operation start instruction signal NSET (FIG. 9B) is generated by a pulse generator (not shown in FIG. 7). RS FF 11 is set in response to signal NSET, and $\overline{Q}$ output signal N1 (FIG. 9D) from RS FF 11 becomes "L". In this case, RS FF 13 is held in the reset state, and its $\overline{Q}$ output signal N2 (FIG. 9E) is set at "H". Then, signal NREQ (FIG. 9F), or an output signal from NAND gate 14, becomes "H", and output signal NGO (FIG. 9G) from NOR gate 18 also becomes "H". Control circuit 19 receives signal NGO and causes normal operation word line drive signal NWL (FIG. 9H), corresponding to the current address input signal, to become "H". The word line (WL) is thus set active.

When the word line is rendered operative, sense amplifier enable signal SAE (FIG. 9I) becomes "H" when a predetermined period of time has elapsed from the leading edge (t2 in FIG. 9H) of NWL="H", in the same manner as has already been described. The operation of sense amplifier 53 in FIG. 1 is then initiated. Meanwhile, after signal SAE (FIG. 9I) becomes "H", NAND gate 24 generates pulse signal N3 (FIG. 9J) having a predetermined pulse width of "L" level in the same manner as has already been described above.

When write enable signal WE (FIG. 9C) becomes "H" at time t3, output signal N5 (FIG. 9L) from NAND gate 29 becomes "L", and output signal N4 (FIG. 9K) from NAND gate 28 is kept "H" even after signal N3 (FIG. 9J) becomes "H". Then, signal CDE (FIG. 9M) is kept "H" after time t3, and column decoder 54 in FIG. 1 is kept operative. In this case, the word line is not rendered operative by control circuit 33, and signal NWL is kept "H".

Signal N4 (FIG. 9K) and signal CDE (FIG. 9M) are kept "H" until write enable signal WE (FIG. 9C) becomes "L" at time t4. At this timing, input data is written in memory cell 51 in FIG. 1, in response to the logic level change of signal WE. The subsequent operations are the same as those shown in FIGS. 8A to 8S.

In operations of FIGS. 10A to 10N, the input timing of write enable signal WE (FIG. 10C) is different from that of FIG. 8C or 9C. More specifically, after chip enable signal $\overline{CE}$ (FIG. 10A) becomes "L" at time t1, word line drive signal NWL (FIG. 10H) and column decoder enable signal CDE (FIG. 10M) are pulsated. Control circuit 33 is rendered operative in response to signal NWL at time t3. Normal operation end instruction signal NRST (FIG. 10N) is generated by control circuit 33 at time t3. RS FFs 11 and 13 are reset in response to signal NRST, and output signals N1 and N2 (FIGS. 10D and 10E) become "H" at time t3. Then, output signal NREQ (FIG. 10F) from NAND gate 14 becomes "L" at time t3. If RS FF 12 is set at time t3 while refreshing operation request signal RREQ (not shown in FIG. 10, but shown in FIG. 8P) has already been set at "H", refreshing operation is initiated from time t3.

Write enable signal WE (FIG. 10C) becomes "H" at time t4, and signal N2 (FIG. 10E) becomes "L". Then, signal NREQ (FIG. 10F) becomes "H" again. Thereafter, the same operations, as have been described with reference to FIGS. 8A to 8S, are performed, so that data is written when signal WE becomes "L" at time t5.

Operations of FIGS. 11A to 11N are substantially the same as those of FIGS. 10A to 10N, except that write enable signal WE (FIG. 11C) becomes "H" at time t3 and that normal operation start instruction signal NREQ (FIG. 11F) does not become "L" at time t3, since signal N2 (FIG. 11E) is set at "L" even after column decoder enable signal CDE is pulsated (after time t3 in FIG. 11M). In this case, control circuit 33 generates signal NRST (after time t3 in FIG. 11N) in order to again set word line drive signal NWL (FIG. 11H) at "H". Signal NRST is input to NOR gate 18 to reset the logic level of signal NGO (FIG. 11G) to "L". After this resetting, the same operations, as have been described with reference to FIGS. 8A to 8S, are performed. Data is written at time t4 when signal WE becomes "L".

As is apparent from the above description, the word line, corresponding to the designated address, is continuously rendered operative (NWL="H") for the write cycle period (WE="H") in the read modify write mode. When a refreshing operation request is output in this period (NREQ="H"), after the write operation is completed, the word line is rendered operative (RREQ="H") to initiate refreshing operation. For this reason, the operation cycle period in the data write mode (WE="H") can be set to be equal to the read cycle period according to the present invention, unlike in the arrangement shown in FIG. 3. In addition, according to the present invention, data can be normally written at all data write timings.

Figure 12:
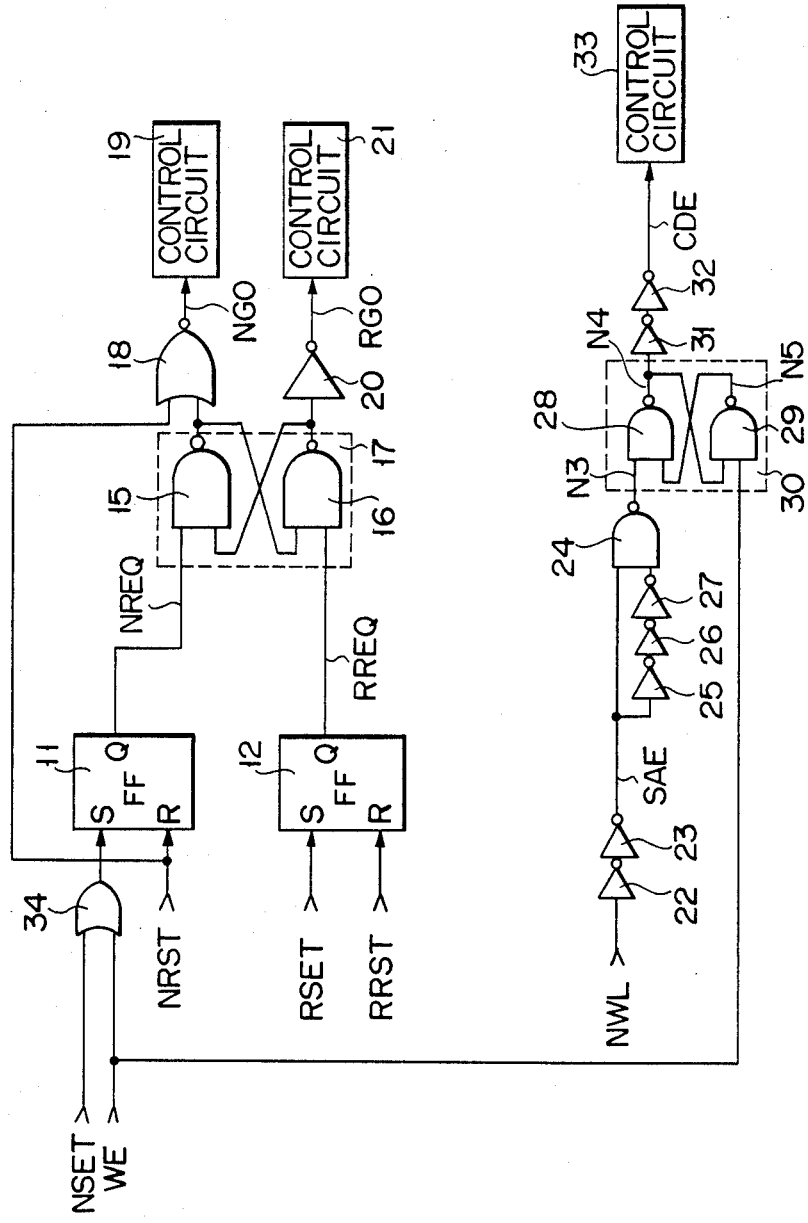
FIG. 12 is a circuit diagram of a DRAM control circuit according to another embodiment of the present invention.

FIG. 12 is a circuit diagram showing an arrangement according to another embodiment of the present invention. The circuit in FIG. 12 is substantially the same as that in FIG. 7, except that RS FF 13 and NAND gate 14 in FIG. 7 are omitted while OR gate 34 is added to the arrangement of FIG. 12. Normal operation start instruction signal NSET and write enable signal WE are supplied to OR gate 34. An output signal from OR gate 34 is supplied as a set input signal to RS FF 11. Q output signal NREQ from RS FF 11 is supplied to selection circuit 17.

When the circuit of FIG. 12 is operated according to the timing charts of one of those in FIGS. 8 to 11, after normal operation start instruction signal NSET is generated (e.g., after time t1 in FIG. 8B), normal operation request signal NREQ (e.g., FIG. 8F) always becomes "H". If the circuit of FIG. 12 is operated according to the timing chart of FIGS. 10A to 10N, after write enable signal WE (FIG. 10C) is generated, normal operation request signal NREQ (FIG. 10F) becomes "H" again. Therefore, RS FF 13 in FIG. 7 can be omitted in the embodiment of FIG. 12 and, instead, OR gate 34 which receives signals NSET and WE can be used to set RS FF 11 in response to the output signal from OR gate 34.

Figure 13:
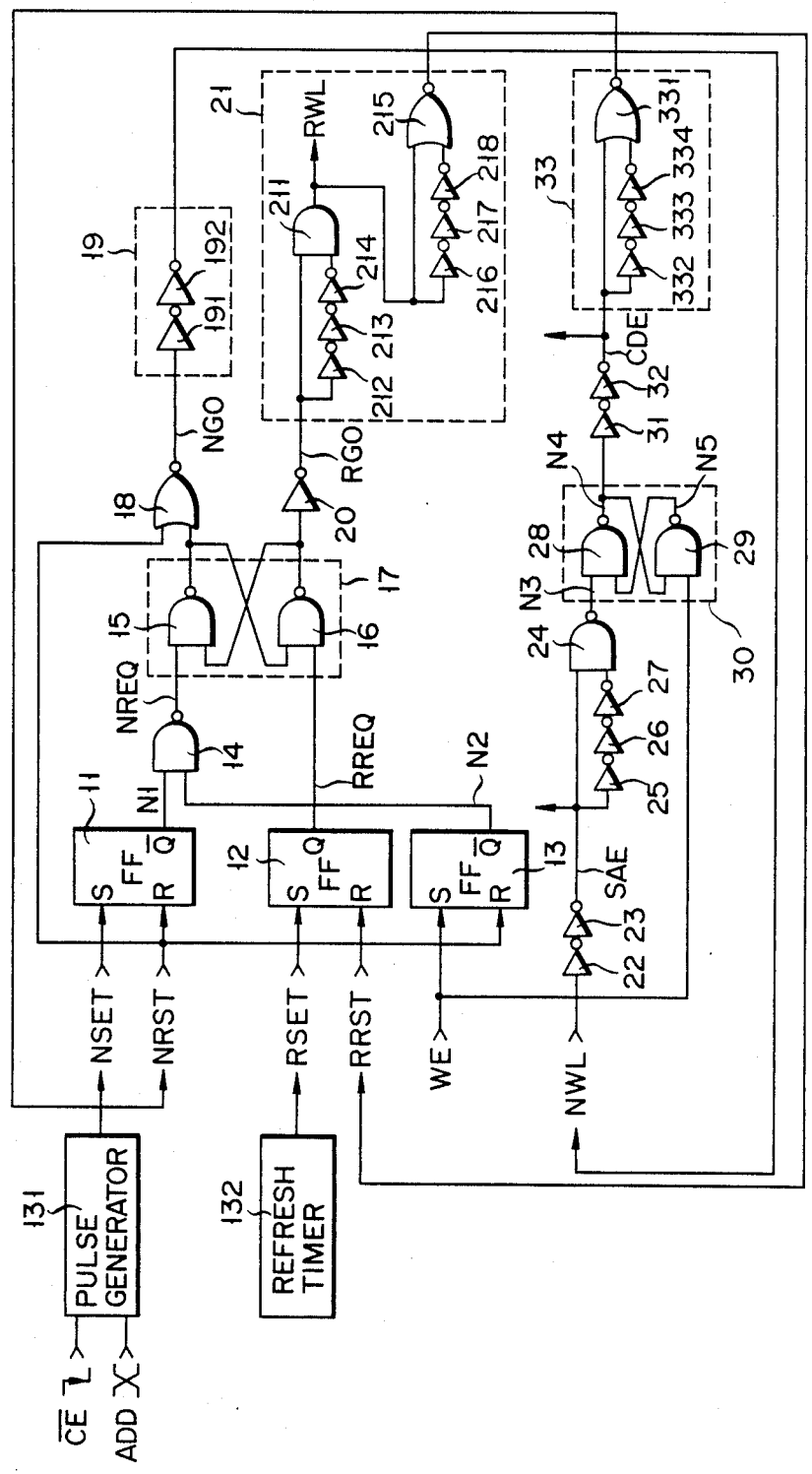
FIG. 13 is a circuit diagram showing in detail the configuration of control circuits 19, 21, and 33 in FIG. 7.

FIG. 13 is a circuit diagram showing in detail the configuration of control circuits 19, 21, and 33 in FIG. 7. In FIG. 13, pulse generator 131 generates normal operation start instruction signal NSET (FIG. 8B) according to address input signal ADD, in response to the signal edge of $\overline{CE}$. RS FF 11 is then set in response to signal NSET, and $\overline{Q}$ output signal N1 (FIG. 8D) thereof becomes "L". Normal operation end instruction signal NRST for resetting RS FF 11 is output from control circuit 33. Circuit 33 is formed of NOR gate 331 whose first input receives signal CDE from inverter 32, and whose second input receives a phase-delayed signal of signal CDE, via series-connected inverters 332-334. Signal NRST is obtained from NOR gate 331.

Refreshing operation start instruction signal RSET (FIG. 8O) is output from refreshing timer 132. RS FF 12 is set in response to signal RSET, and refreshing operation request signal RREQ (FIG. 8P), obtained from the Q output of RS FF 12, becomes "H". Refreshing operation end instruction signal RRST for resetting RS FF 12 is output from control circuit 21. Circuit 21 includes AND gate 211 whose first input receives signal RGO from inverter 20, and whose second input receives a phase-delayed signal of signal RGO, via series-connected inverters 212-214. Refreshing word line drive signal RWL (FIG. 8R) is obtained from AND gate 211. Circuit 21 further includes NOR gate 215 whose first input receives signal RWL from AND gate 211, and whose second input receives a phase-delayed signal of signal RWL, via series-connected inverters 216-218. Refreshing operation end instruction signal RRST (FIG. 8S) is obtained from NOR gate 215.

Word line drive signal NWL is obtained from control circuit 19. Circuit 19 includes two series-connected inverters 191 and 192 which serve to delay the signal edge of signal NGO from NOR gate 18.

The circuit arrangement of FIG. 13, other than those as described above, is the same as that shown in FIG. 7. Incidentally, control circuits 19, 21, and 33 shown in FIG. 13 can be applied to the corresponding control circuits in FIG. 12.

According to the present invention as described above, there is provided a semiconductor memory (DRAM) control circuit for refreshing storage data within the read/write access period, wherein data can be written without increasing the cycle time.

The present invention is not limited to the particular embodiments described above. Various changes and modifications can be made within the scope of the invention. In the above embodiments, column decoder enable signal CDE is used to control column decoder 54 in FIG. 1. However, the present invention is applicable to a semiconductor memory (DRAM) in which its column decoder is controlled in response to only a column address signal without using signal CDE.

Incidentally, there are two Japanese Patent Applications related to the present invention:

(1) Japanese Patent Applications No. 59-111894 filed at the Japanese Patent Office on May 31, 1984, which corresponds to U.S. patent application No. 739,171 filed at the U.S. Patent Office on May 30, 1985 (Inventors: Sakurai et al.); and (2) Japanese Patent Applications No. 61-029320 filed at the Japanese Patent Office on Feb. 13, 1986, which will be filed at the U.S. Patent Office by Feb. 13, 1987 (Inventors: Sawada et al.).

Figure 2:
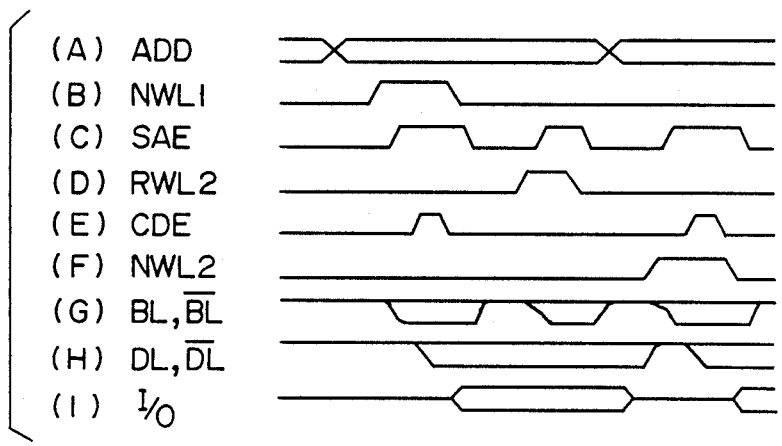
FIGS. 2A to 2I are timing charts for explaining the operation of the DRAM in FIG. 1.
Figure 3:
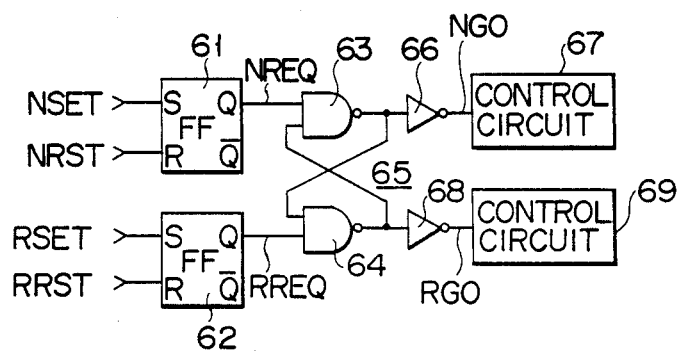
FIG. 3 is a circuit diagram of an arrangement for switching between the read/write operation and the refreshing operation, the arrangement having been invented by the present inventors before the present invention was made.
Figure 4:
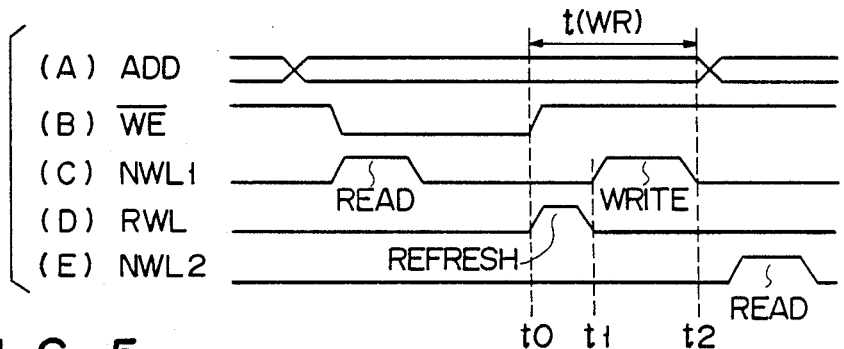
FIGS. 4A to 4E are timing charts for explaining one operation of the circuit in FIG. 3.

FIGS. 1 and 2 of the present patent application are disclosed in the above application (1), and FIGS. 3 and 4 of the present patent application are disclosed in the above application (2). All disclosures of the above applications (1) and (2) are now hereby expressly incorporated by reference in the present patent application.

What is claimed is:

1. A dynamic read/write memory in which refreshing for storage data is performed within a given read/write cycle period, comprising:
    first means, coupled to a word line of said memory, for continuously rendering operative, within the write cycle period, said word line defined by a predetermined address of said memory, said first means including:
    first signal generating means, responsive to a data write request signal, for generating a normal operation request signal which serves to render said word line operative when said data write request signal is supplied,
    selection means, coupled to said first signal generating means and being responsive to a predetermined refreshing operation request signal, for selecting and outputting one of said normal operation request signal and said predetermined refreshing operation request signal, and
    first word line control means, coupled to said selection means and said word line, for generating a word line drive signal on said word line used for performing data writing in said memory, the generation of said word line drive signal being responsive to the selected signal, representing said normal operation request signal, and to a reset signal indicating that a data read request for said memory is disabled; and
    second means, coupled to said first means, for rendering operative said word line only within a given period in the read cycle period.

2. A memory according to claim 1, wherein said first means further includes:
    signal latch/transfer control means for providing an output signal, obtained by latching the word line drive signal from said first word line control means, when the data write request signal is generated, and for providing an output signal, obtained by selectively transferring the word line drive signal, when the data write request signal is not generated.

3. A memory according to claim 2, wherein said second means includes:
    second signal generating means for supplying the refreshing operation request signal to said selection means to render the word line operative when data refreshing is to be performed.

4. A memory according to claim 3, wherein said second means further includes:
second word line control means for enabling and disabling the word line drive signal to perform data refreshing in response to said refreshing operation request signal.

5. A memory according to claim 4, wherein said first means further includes:
third word line control means, responsive to the output signal from said signal latch/transfer control means, for supplying said first signal generating means with a signal which disables said word line drive signal that was previously enabled by said first word line control means.

6. A memory according to claim 2, further comprising:
a column decoder, coupled to said word line and being responsive to the output signal from said signal latch/transfer control means, for selecting a prescribed memory cell from the memory cells in said memory.

7. A memory according to claim 6, further comprising:
a data sense amplifier, coupled to said word line and responsive to the word line drive signal enabled by said first word line control means, for sensing the storage data in a memory cell of said memory.

8. A memory according to claim 1, further comprising:
a data sense amplifier, coupled to said word line and being responsive to the word line drive signal enabled by said first word line control means, for sensing the storage data in a memory cell of said memory.

9. A dynamic read/write memory in which stored data is refreshed within a read cycle period and a write cycle period, comprising:
first means, coupled to a word line of said memory that is defined by a predetermined address value, for rendering said word line operative substantially continuously within the write cycle period in response to a data write request signal, said first means including:
first request signal generating means, responsive to said data write request signal, for generating a normal operation request signal,
selection means, coupled to said first signal generating means and receiving a predetermined refreshing operation request signal, for selecting and outputting one of said normal operation request signal and said predetermined refreshing operation request signal, wherein said normal operation request signal is selected and output when said normal operation request signal is high and is received before said predetermined refreshing operation request signal, and
first word line control means, coupled to said selection means and receiving a reset signal and the selected signal, for generating a word line drive signal on said word line to render said word line operative, wherein said word line drive signal is generated when the selected signal is the normal operation request signal and the reset signal indicates that a data read request for said memory is disabled; and
second means, coupled to said first means, for rendering said word line operative only within a portion of the read cycle period, said portion being substantially less than the entire read cycle period.

* * * * *